United States Patent [19]
Watanabe et al.

[11] Patent Number: 5,907,507
[45] Date of Patent: May 25, 1999

[54] MICROCOMPUTER AND MULTI-CHIP MODULE

[75] Inventors: Katsuyoshi Watanabe; Takatsugu Kitora, both of Tokyo, Japan

[73] Assignee: Mitsubishi Denki Kabushiki Kaisha, Tokyo, Japan

[21] Appl. No.: 08/975,204

[22] Filed: Nov. 20, 1997

[30] Foreign Application Priority Data

Jul. 16, 1997 [JP] Japan ................................ 9-191648

[51] Int. Cl.⁶ .................................................. G11C 16/04
[52] U.S. Cl. .................... 365/189.01; 365/104; 365/226; 395/800; 395/872
[58] Field of Search ................................... 365/104, 226, 365/240, 189.01, 230.01, 198; 395/872, 800

[56] References Cited

U.S. PATENT DOCUMENTS 5,581,792  12/1996  Caudel et al. ............................ 395/872
5,615,383  3/1997   Caudel et al. ............................ 395/800

FOREIGN PATENT DOCUMENTS 61-262871  11/1986  Japan .

OTHER PUBLICATIONS

Gijutsu, Denshi; "Cuontermeasures for Noise in Electric Devices" Electronic Technology, vol. 38, No. 5, 1996. (Partial English Translation).

*Primary Examiner*—David Nelms
*Assistant Examiner*—Thong Le
*Attorney, Agent, or Firm*—Leydig, Voit & Mayer

[57] ABSTRACT

A microcomputer includes dedicated output transistors for driving a bus for access to an external memory. The output transistors are smaller in size than transistors for other input/output ports. The microcomputer and the external memory are interconnected through a double-sided printed-circuit board forming a multi-chip module (MCM). The module has pin assignments substantially the same as those of a single-chip microcomputer. Selector circuits are included in the module to test specifically the external memory connected to the selectors.

9 Claims, 12 Drawing Sheets

TOP VIEW

BOTTOM VIEW

MICROCOMPUTER AND MULTI-CHIP MODULE

BACKGROUND OF THE INVENTION

1. Field of the Invention

The present invention relates to a semiconductor integrated circuit device and more particularly a microcomputer and a multi-chip module incorporating the same.

2. Description of the Prior Art

A growing number of connection terminals attached to semiconductor devices have been making it increasingly difficult to route the wiring properly for installing such a device onto a substrate. When mounted on a substrate of an enlarged scale, semiconductor devices are required to have a bus structure whose driving capacity should be large enough to transmit signals accurately throughout the substrate. These developments have been accompanied by extraneous radiation noise that requires suitable techniques for reduction. In addition, given the fact that test costs form an increasing proportion of overall semiconductor fabrication expenditures, there is a growing need for designs that facilitate testing procedures.

Some typical conventional examples relevant to the scope of this invention are described below.

FIG. 14 is a block diagram outlining the basic design of a circuit comprising a conventional microcomputer. In FIG. 14, reference numeral 1 stands for a printed-circuit board; 2 for a microcomputer comprising a ROM; 3 for an external memory; 4 and 5 for a first and a second peripheral circuit respectively; and 6 and 7 for a bus each. The external memory 3 is connected with the microcomputer 2 via the bus 6 interconnecting the circuit elements. The peripheral circuits 4 and 5 are connected with the microcomputer 2 via the bus 6 and are also connected to each other by way of the bus 7.

Upon access to the external memory 3, the microcomputer 2 transmits data and an address thereto over the bus 6. The microcomputer 2 also utilizes the bus 6 when controlling the peripheral circuits 4 and 5. The peripheral circuits 4 and 5 use the bus 7 for data exchanges therebetween.

FIG. 15 is a block diagram showing a typical configuration of the microcomputer 2. In FIG. 15, reference numeral 65 represents an output transistor group connected to the bus 6. The output transistor group 65 is activated when the microcomputer 2 either accesses the external memory 3 or controls the peripheral circuits 4 and 5. Here, it should be noted that the bus 6 connected to the external memory 3 has a large parasitic capacitance since it is also connected to the peripheral circuits 4 and 5. The need to drive that bus 6 at a high speed makes it impossible to reduce the driving capacity of the transistors constituting the output transistor group 65.

The first conventional example works as follows: a microcomputer terminal is selected to access the internal ROM functions as a normal port. In extended memory mode in which the microcomputer 2 gains access to the external memory 3, the bus functions as an address or data bus operating at a high speed. Illustratively, where the microcomputer 2 operates on a basic clock of 10 MHz, the external memory 3 is accessed in 100 ns. The microcomputer 2 accesses the internal ROM and, as needed according to the program contained therein, gains access to the peripheral circuits 4 and 5 via the terminal acting as the normal port also connected to the external memory 3. The speed at which to access the peripheral circuit 4 or 5 does not exceed the speed in accessing the external memory 3. If the second peripheral circuit 5 needs to be controlled both by the microcomputer 2 and by the first peripheral circuit 4, these circuit elements must be interconnected using suitable signals over the bus 7.

FIG. 16 is an explanatory view showing how a plane formed by a current loop forms an angle with respect to an observation point. In FIG. 16, reference numeral 62 stands for a closed circuit formed by a current, 63 for a plane constituted by the current circuit, and 64 for a power supply. According to Denshi Gijutsu ("Electronic Technology," a Japanese publication) 1996, Vol. 38, No. 5, the amount of radiation energy EM stemming from extraneous radiation noise is given by the expression (1) below:

$$E_M = 120\{\sqrt{(\mu_S/\epsilon_S)}\}\pi^2 IS(e^{-JKr}/\lambda^2 d)\sin\theta (V/m) \quad (1)$$

where $\mu_S$ stands for relative magnetic permeability, $\epsilon_S$ for relative dielectric constant, I for the amount of current, S for the area occupied by the loop formed by current, Kr for propagation coefficient, λ for wavelength, and θ for the angle between observation point and plane formed by current loop.

Because a plurality of circuit elements such as the peripheral circuits 4 and 5 and external memory 3 are connected to the bus 6, their wiring needs to be routed suitably over the printed-circuit board. Since the load capacitances of these circuit elements are parasitic on the wiring of the bus 6, the output transistor group 65 needs to have a driving capacity large enough to drive the bus 6 at high speed. However, the use of transistors with large driving capacities necessarily entails an increase in currents that flow through the wiring provided the impedance of external elements remains constant.

FIG. 17 is a graphic representation showing how time and voltage are related in comparing leading edges of output waveforms of transistors with different driving capacities. As illustrated in FIG. 17, a transistor with a large driving capacity generally produces an output waveform 71 with a steeper leading edge and a smaller wavelength λ than a transistor with a small driving capacity yielding an output waveform 72. That is, as per the expression (1) above, transistors with large driving capacities are bound to have growing amounts of radiation energy $E_M$ stemming from extraneous radiation noise.

Although it is conceivable to use a buffer on the printed-circuit board to suppress currents so as to increase the driving capacity of the bus 6, the scheme has the disadvantage of increasing the number of parts used. In any case, the wiring tends to be elongated and parasitic capacities are raised, which makes it difficult to boost the speed of circuit operation. That is because wiring delay is generally proportionate to capacity and resistance involved. Furthermore, any of the conventional techniques above for enhancing the driving capacity of the output transistor group 65 entails an increased amount of currents. This promotes power dissipation and involves an increase in extraneous radiation.

In another conventional basic board design of circuits such as a circuit including the microcomputer in FIG. 14, it has become difficult to optimize the layout of the numerous circuit elements. One conventional solution to that bottleneck is the adoption of a multi-layer board concept at the basic design stage whereby signal lines are routed across layers. Another solution is to have peripheral elements mounted on the back of the board in a double-sided printed-circuit design.

FIGS. 18A and 18B show pin terminal arrangements of a conventional microcomputer 2' and of an external memory 3'. FIG. 18A is a pin terminal layout view of the external memory 3', and FIG. 18B is a pin terminal layout view of the microcomputer 2'. In the two figures, reference numerals 30a through 30h denote lines and pin terminals connecting the microcomputer 2' to the external memory 3' via the bus 6, the pins and lines being interconnected where they have the same reference numerals. Between the two layout views, the pin terminals 30a through 30h connecting the microcomputer 2' to the external memory 3' via the bus 6 do not match in sequence. The layout mismatch requires lines to be crossed on the board, which makes it impossible to route the wiring over the shortest possible distances.

In another conventional semiconductor integrated circuit design, the circuits inside a chip share common power supplies with the exception of special-purpose components (clock, analog power supply, etc.). FIG. 19 is a schematic view outlining power supply connections of a conventional microcomputer. In FIG. 19, reference numeral 2e stands for a microcomputer; 33' and 34' for a power supply line and a ground line respectively; 39' and 40' for a power supply pad and a ground pad respectively; 37b and 38b for a bus each; 37a for an output transistor group for driving the bus 37b connected to an external memory; and 38a for an output transistor group for driving the bus 38b connected to peripheral circuits.

The third conventional example works as follows: the power supply line 33' connected to the power supply pad 39' supplies power not only to the output transistor group 37a but also to the output transistor group 38a. The ground line 34' connected to the ground pad 40' feeds both output transistor groups 37a and 38a with ground potential. When transistors in the output transistor group 37a connected to the memory bus 37b are switched at high speed, the wavelength λ in the expression (1) above is diminished. This oscillates the power supply line 33' at a high frequency of, say, 100 MHz, generating radiation noises inside the chip. Such radiation noise propagates through the other power supply line to reach other output pins which release the noises.

According to another conventional chip layout design, multi-chip module (MCM) technology allows a plurality of bare chips to be assembled into a single module that is small and lightweight. Because the multi-chip module has numerous wires, the inclusion in a single package of both a microcomputer and a memory subject to access at high frequency contributes to reducing the quantity of the wiring on the board. This setup, however, requires a general-purpose memory to be installed in the multi-chip module. The arrangement is costly for the manufacturer. It is thus desired to replace such a memory with an inexpensive built-in mask ROM of a single-chip microcomputer.

FIG. 20 is a block diagram of a conventional multi-chip module (MCM) constitution. In FIG. 20, reference numeral 53' stands for an MCM package; 54' for a microcomputer; 55 for an external memory; 101 for a normal port; 102 for a memory bus; 57 for a normal port input/output signal line group of the microcomputer 54'; and 58 for a memory bus signal line group of the microcomputer 54'. The memory bus signal line 58 is connected to the external memory 55 but, with no need to attach to any other component, is not connected to any external terminal of the MCM package 53'.

The microcomputer of FIGS. 14–17 configured as described above, is characterized by a large parasitic capacitance of the bus 6. That proves to be a major impediment to improving the access speed of the device as a whole. Attempts to boost the operating speed increase the amount of currents resulting in higher power dissipation in conjunction with the driving capacity of output transistors; extraneous radiation noise is also promoted.

The microcomputer of FIGS. 18A–18B configured as described above, has an elongated bus 6 extending from the microcomputer 2. This structure enlarges the area S of the loop formed by currents. According to the expression (1) above, the structure increases extraneous radiation noise. Because the wiring on the board is routed over long distances, the parasitic capacitance is increased along with signal delays, which keeps the speed of circuit operation low.

The microcomputer 2e of FIG. 19 configured as described above, has its output transistor groups 37a and 38a switched at high speed, generating radiation noise therebetween. The noise tends to propagate over the power supply line 33' and ground line 34.

The multi-chip module (MCM) configured as described above, has a microcomputer chip and a general-purpose memory chip simply wired on a multi-chip module board. Compared with the single-chip microcomputer setup, the example most often has disparate pin arrangements between the chip and the memory and are subject to worsening noise or power dissipation characteristics. This requires devising a complicated basic design.

The multi-chip module (MCM) of FIG. 20, configured as described above, has the memory bus signal line 58 connected only to the microcomputer 54' and external memory 55. Because the memory bus signal line 58 is not connected to any external terminal of the multi-chip module package, it is impossible to submit the external memory 55 to product inspection and failure analysis.

The microcomputer 54' thus needs to incorporate a circuit for evaluating the inspection and analysis functions in advance or is required to be programmed to let such evaluation be performed in a predetermined manner. These arrangements permit little degree of freedom in inspection and analysis procedures. Furthermore, it is necessary to develop anew test patterns by which to subject the multi-chip module 53' to product inspection. Such development takes time.

SUMMARY OF THE INVENTION

It is therefore an object of the present invention to provide a microcomputer similar to a single-chip microcomputer, operating at high speed with reduced extraneous radiation noise and having reduced levels of power dissipation.

It is another object of the invention to provide a microcomputer comprising a bus structure with reduced wiring capacitance for high-speed operation.

It is a further object of the invention to provide a microcomputer having a power supply line and a ground line producing reduced radiation noise.

It is an even further object of the invention to provide a microcomputer whose driving capability may be changed at short notice.

It is a still further object of the invention to provide a multi-chip module capable of being replaced at short notice by a single-chip microcomputer incorporating a mask ROM.

It is a yet further object of the invention to provide a microcomputer allowing an external memory to be checked for failure thereby eliminating the need to develop test patterns.

In carrying out the invention and according to a first aspect thereof, there is provided a microcomputer comprising first transistors for driving first signal lines needed to access an external memory, and first terminals dedicated to the first signal lines, wherein the first transistors are smaller in size than second transistors connected to other input/output ports.

The microcomputer according to the first aspect of the invention minimizes the wiring load capacity of the first signal lines between the external memory and the microcomputer. Because the first transistors for driving the bus connected to the frequently accessed external memory are reduced in driving capability, the amount of currents flowing through the entire circuit is lowered. This results in reduced power dissipation. As stipulated by the expression (1) above, the reduced currents suppress the intensity of radiated energy and thus minimize extraneous radiation noises. Furthermore, the lines connected to another external circuit are subject to reduced access frequency, which also diminishes the radiant energy and lessens extraneous radiation noises.

In a first preferred structure according to the invention, the first terminals connected to the first transistors for driving the first signal lines needed to access the external memory and second terminals connected to the second transistors for driving an external circuit other than the external memory are arranged alternately.

The first preferred structure of the invention minimizes the wiring capacity of the first signal lines operating at high speed. This allows the microcomputer to operate at high speed with reduced extraneous radiation noises and on lowered levels of power dissipation.

In a second preferred structure according to the invention, the microcomputer and the external memory are mounted on the face and the back of a substrate wherein the terminals of the microcomputer for accessing the external memory are arranged to coincide in layout with the terminals of the external memory so that lines interconnecting the corresponding terminals of the microcomputer and the external memory will not cross one another when laid out over the shortest possible distances on the substrate.

The second preferred structure of the invention provides for a two-sided substrate design because there is no crossed wiring. The area occupied by the loop formed by currents flowing through wiring between the microcomputer and the external memory is reduced. That decrease in the area S, as per the expression (1) above, lowers extraneous radiation noises. Because the wiring is made as short as possible, the parasitic capacity involved is lessened and the speed of circuit operation is enhanced correspondingly.

According to a second aspect of the invention, there is provided a microcomputer comprising: a first power supply line and a first ground line used by first transistors for driving first signal lines to access an external memory; and a second power supply line and a second ground line used by second transistors for accessing another external circuit; wherein the first and the second power supply lines and the first and the second ground lines are separated from pads of a chip.

In the microcomputer according to the second aspect of the invention, any noises that may occur over the first ground line or the first power supply line operating at a high frequency like that of the first transistors accessing the external memory will not propagate to the second power supply line or second ground line. Radiation noises are thus reduced.

In a third preferred structure according to the invention, the first power supply line and the first ground line form a first power supply system, and the second power supply line and the second ground line constitute a second power supply system. One of the first and the second power supply systems is selected by designating at least one mask used during wafer processing.

In the third preferred structure of the invention, either the first or the second power supply line is selected through a mask option in a through-hole making process or like processes. This makes it possible to select a power supply line compatible with the driving capability of the first or the second transistors regardless of how long the development stage is allowed to last.

In a fourth preferred structure according to the invention, the microcomputer further comprises a selector circuit for selecting, as per register contents, one of the first and the second power supply systems as a power supply system for powering the first and the second transistors.

The fourth preferred structure of the invention allows the first and the second power supply lines to be switched by software. That is, users may select optimum transistors as needed while programming is concurrently under way. Because the first power supply line is separated from the second power supply line in accordance with the chip set used, a program-based selection scheme allows a separate power supply to feed power to specific first signal lines connected to the external memory that can generate noises.

In a fifth preferred structure according to the invention, one of the first and the second power supply systems is selected together with transistors to be powered by the selected power system.

The fifth preferred structure of the invention permits the use of a mask option to select either the first or the second power supply system as well as the first or the second transistors to be powered by the selected power supply system. The structure enables the delivery of products whose driving capability is changed at short notice in accordance with the customer's set.

According to a third aspect of the invention, there is provided a multi-chip module comprising a microcomputer and an external memory, wherein pin assignments of the module are substantially the same as those of a microcomputer using a built-in memory.

As with single-chip microcomputers, the multi-chip module according to the third aspect of the invention makes usable all terminals intended for output to the outside of the chip. Since the multi-chip module and a microcomputer have similar pin assignments and functions, the replacement of one with the other is easy to accomplish. When the multi-chip module is used in conjunction with a microcomputer provided according to the first aspect of the invention, in the second preferred structure of the invention or according to the second aspect of the invention, extraneous radiation noises are reduced and power dissipation is lowered. With the double-sided board design in effect, the microcomputer and the external memory occupy the substrate efficiently by taking advantage of back-side connections. This simplifies the device constitution and lowers assembly costs.

According to a fourth aspect of the invention, there is provided a microcomputer capable of accessing a general-purpose memory chip and an external memory in a multi-chip module, the microcomputer comprising a selector for selectively connecting input/output signals upon input of a control signal which is either nonactive or active, wherein an output terminal of the selector connects only input/output signals from the microcomputer in response to the nonactive control signal, and wherein, in response to the active control signal, the output terminal of the selector separates input/output signals from the microcomputer while connecting input/output signals of the external memory.

According to the fourth aspect of the invention, the external memory and the microcomputer are separately subjected to their specific failure analysis. Direct input of necessary patterns allows the components to be tested for failure with a high degree of freedom. Because the test patterns used to test the external memory and microcomputer are also utilized unmodified in product testing, the time required for test pattern development is shortened.

These and other objects, features and advantages of the invention will become more apparent upon a reading of the following description and appended drawings.

BRIEF DESCRIPTION OF THE DRAWINGS

FIG. 18A showing pin terminal assignments of the external memory, FIG. 18B depicting pin terminal assignments of the microcomputer;

DETAILED DESCRIPTION OF THE PREFERRED EMBODIMENTS

Preferred embodiments of the invention will now be described with reference to the accompanying drawings.

Embodiment 1

Figure 1:
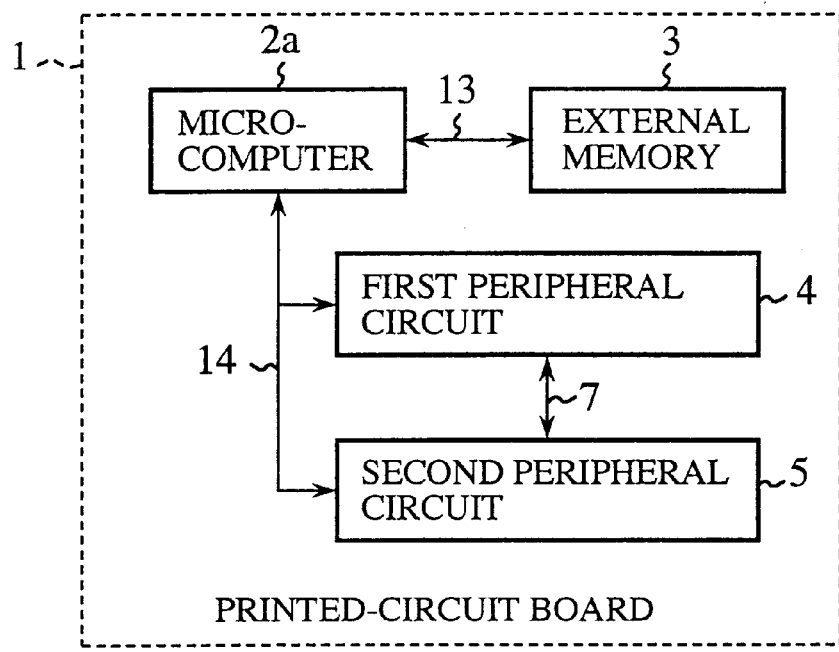
FIG. 1 is a block diagram showing a basic design of a circuit including a microcomputer practiced as a first embodiment of the invention.

FIG. 1 is a block diagram showing a basic design of a circuit including a microcomputer practiced as the first embodiment of the invention. The microcomputer is equipped with a dedicated terminal for access to an external memory through a separately furnished bus. In FIG. 1, reference numeral 1 stands for a printed-circuit board (simply called the board hereunder); 2a for a microcomputer incorporating a ROM; 3 for an external memory that is provided outside the microcomputer 2a; 4 and 5 for a first and a second peripheral circuit located furnished externally to the microcomputer 2a; 13 for a bus acting as a first signal line; 14 for a bus serving as a second signal line; and 7 for a bus for interconnecting the peripheral circuits 4 and 5. The external memory 3 is connected to the microcomputer 2a via the bus 13. The peripheral circuits 4 and 5 are connected to the microcomputer 2a through the bus 14 and are interconnected via the bus 7.

Figure 2:
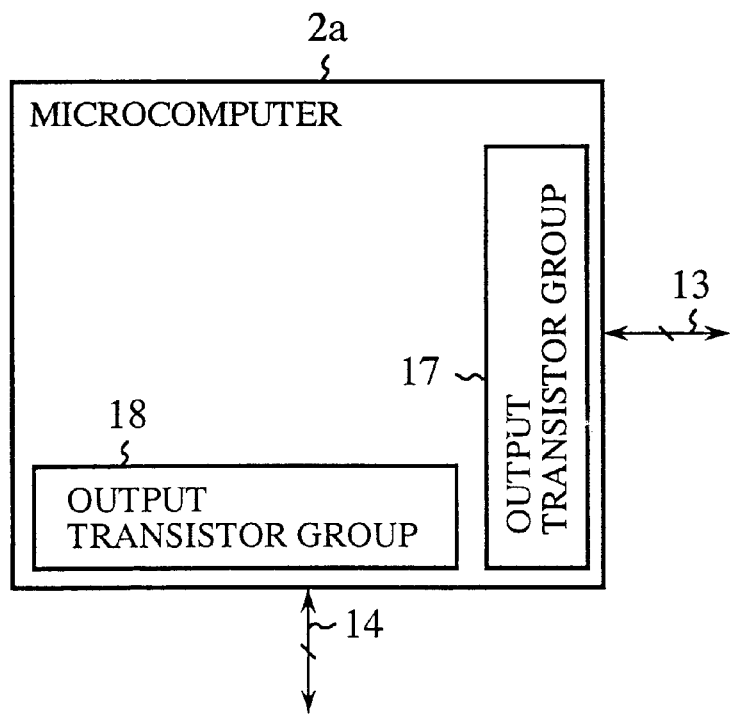
FIG. 2 is a partial explanatory view of the microcomputer as the first embodiment.

FIG. 2 is a block diagram illustrating how the microcomputer 2a is structured. In FIG. 2, reference numerals 17 and 18 stand for output transistor groups acting as first and second transistors; and 13 and 14 for a bus each. The bus 13 is connected to the output transistor group 17 that is activated when the microcomputer 2a accesses the external memory 3. The output transistor group 18 is connected to the bus 14.

In the structure described above, the external memory 3 is connected only to the microcomputer 2a and the wiring necessary for the connection need not extended over the board. Because the peripheral circuits 4 and 5 are not involved in the connection, the parasitic capacitance of the wiring is reduced and so is the driving capability of the output transistor group 17. On the other hand, the wiring that connects the output transistor group 18 to the peripheral circuits 4 and 5 is often routed in an elongated manner over the printed-circuit board and has a large parasitic capacitance. This requires affording a large driving capability to the output transistor group 18. Illustratively, the output impedance of the output transistor group 17 is set for as high as 200Ω, while the output transistor group 18 is set to have a low output impedance of about 50Ω.

Below is a description of how the first embodiment works. The buses 13 and 14 operate independently of each other. Thus while the external memory 3 is being accessed, the bus 14 connected to the peripheral circuits 4 and 5 is not driven. Likewise, the bus 13 is not driven while the peripheral circuit 4 or 5 is being accessed.

The bus 13 works as a data bus or an address bus for program data exchanges between the microcomputer 2a and the external memory 3. As such, the bus 13 is accessed at high frequency. If the bus 13 is dedicated to the access of an externally furnished memory such as the one in the first embodiment, the load capacitance of the wiring on the board between the external memory 3 and the microcomputer 2a may be lowered. It follows that the output transistor group 17 need not be increased in size or in driving capability as opposed to the output transistor group 18 for access to the peripheral circuits 4 and 5. With signal delays thus reduced on the board, the operating speed is enhanced.

Because the output transistor group 17 for driving the frequently accessed bus 13 can be reduced in its driving capability, the amount of current flowing through the whole circuit is lowered and power dissipation is lessened. This, according to the expression (1) above, suppresses the intensity of radiation energy and thereby minimizes extraneous radiation noise. Since the bus 14 is connected to the peripheral circuits 4 and 5 that are less frequently accessed than the external memory 3, the bus 14 is subject to less frequent signal changes and has reduced levels of radiation energy intensity over an extended period of time. This also contributes to lowering extraneous radiation noises. Because there is no need to install a buffer arrangement on the board, the number of installed components is made smaller.

As described, the first embodiment separates the bus 14 for access to the external memory 3 functionally from the bus 14 for accessing the peripheral circuits 4 and 5. The structure lowers the wiring load capacity of the bus 14, which lessens loads on the output transistor group 17 for driving the bus 13, which in turn reduces the individual transistors in size. The smaller transistors consuming less currents constitute a microcomputer which operates at higher speeds, produces less extraneous radiation noise, and dissipates less power.

Embodiment 2

FIG. 2 is a block diagram of the microcomputer 2a whose structure has been discussed above in connection with the first embodiment. As illustrated, the output transistor group 17 is connected to first output terminals of the microcomputer 2a for driving the bus 13, the first output terminals being arranged adjacent to one another. The output transistor group 18 is connected to second output terminals of the microcomputer 2a for driving the bus 14, the second output terminals being also arranged adjacent to one another.

Where the microcomputer 2a and external memory 3 are mounted on the board using both sides of the latter, it is necessary to thread the wiring from the output terminals via through holes of the board toward the external memory 3 at the back of the board. If the microcomputer 2a is sealed in a fine pitch package, the through holes are not arranged linearly but laid out in a zigzag fashion to allow for margins between the holes. This makes it impossible to install the bus 13 over the shortest possible distance.

Figure 3:
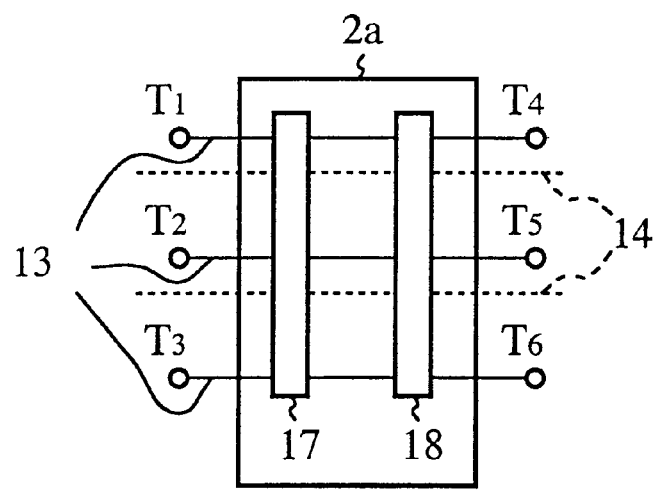
FIG. 3 is a partial explanatory view of a microcomputer practiced as a second embodiment of the invention.

FIG. 3 is a partial explanatory view of a microcomputer 2a having an improved internal structure as the second embodiment of the invention. In FIG. 3, reference numeral 13 stands for a bus connected to the external memory 3; 14 for a bus connected to the peripheral circuits 4 and 5; and T1 through T6 for through holes having contact with the external memory 3 at the back of the board.

How the second embodiment works will now be described. The output transistor group 17 for driving the bus 13 and the output transistor group 18 for driving the bus 14 are connected alternately from the output terminals of the microcomputer 2a to the corresponding bus lines. The arrangement allows the through holes to be arranged linearly, illustratively from T1 through T3 and from T4 through T6 as shown, for connection to the external memory 3 at the back of the board; there is no need to have the through holes T1 through T6 arranged in the conventional zigzag manner for connection to the lines of the bus 13. This makes for the shortest possible wiring of the bus 13 over which rapidly changing signals move, whereby the wiring capacitance is further reduced.

As described, the second embodiment shortens the wiring of the rapidly operating bus 13 for further reductions in wiring capacitance. The second embodiment thus supplements the first embodiment in terms of benefits with faster operation, reduced extraneous radiation noise, and lessened power dissipation.

Embodiment 3

Figure 4:
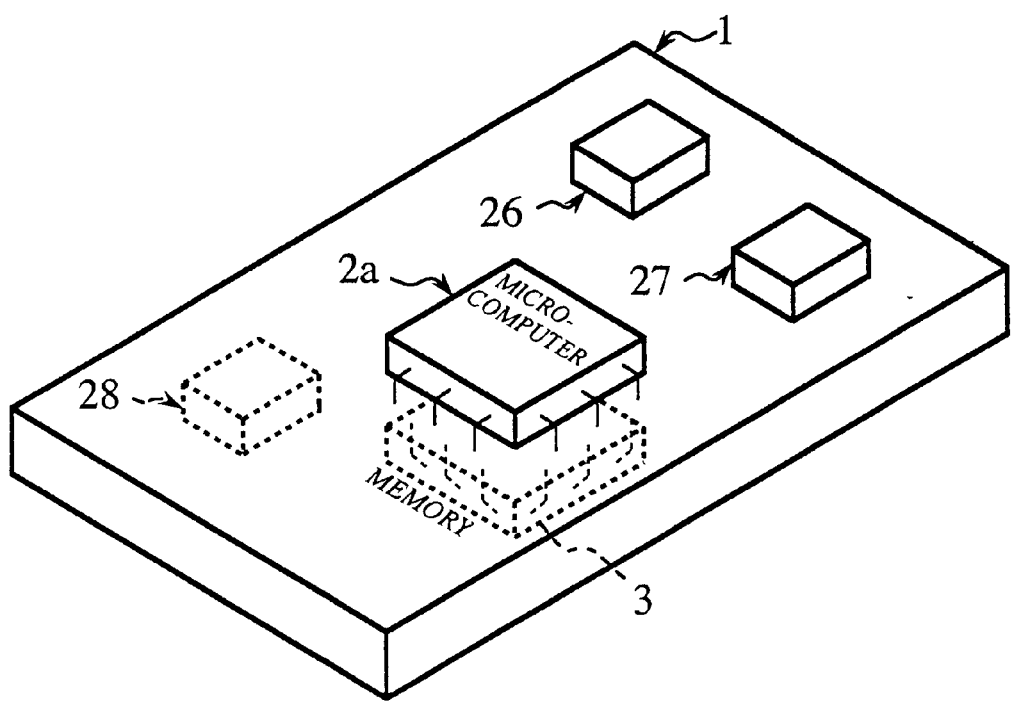
FIG. 4 is a schematic view of a microcomputer practiced as a third embodiment of the invention.

FIG. 4 shows how circuit elements including a microcomputer are mounted on a printed-circuit board as the third embodiment of the invention. In FIG. 4, reference numeral 1 stands for a printed-circuit board; 2a for a microcomputer; 3 for an external memory; 26 for a read-only memory (ROM); and 27 and 28 for a first and a second peripheral circuit respectively (external circuits). The microcomputer 2a and the external memory 3 are mounted on the face and the back of the printed-circuit board in a board-sandwiching manner, with the pins of the microcomputer 2 arranged as shown in FIG. 5 to coincide in layout with those of the external memory 3.

Figure 5:
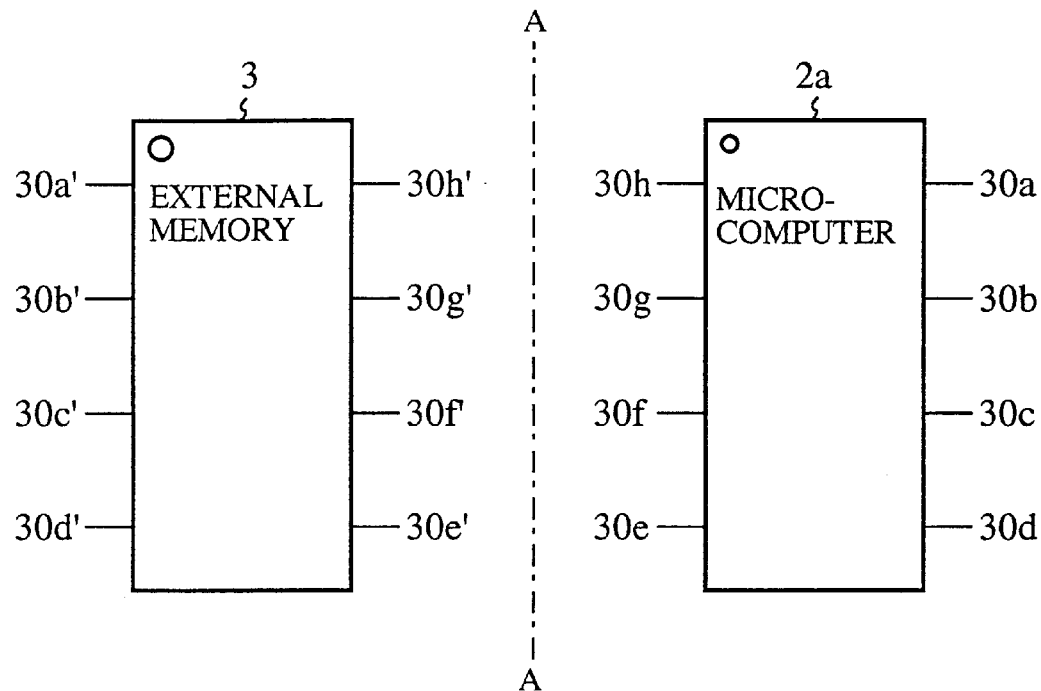
FIG. 5 is a layout view of an external memory and the microcomputer implemented as the third embodiment.

FIG. 5 shows illustratively a setup where the external memory 3 is mounted on the back of the microcomputer 2a. In FIG. 5, reference numerals 30a through 30h represent pin terminals of the microcomputer 2a (i.e., microcomputer terminals) connected to signal lines, and 30a' through 30h' denote likewise pin terminals of the external memory 3 (i.e., external memory terminals) also connected to the signal lines. The pin terminals of the microcomputer 2a and of the external memory 3 are axially symmetrical around a line A—A in FIG. 5. The structure allows the external memory 3 to be attached to the back of the microcomputer 2a with the shortest possible wiring of the bus 13 interconnecting the two devices. The lines of the bus 13 connected to the microcomputer 2a correspond generally on a one-to-one basis with those connected to the external memory 3. Specifically, the signal lines given the same reference numerals are interconnected; a pin terminal 30a' of the external memory 3 is connected to a pin terminal 30a of the microcomputer 2, a pin terminal 30b' is coupled to a pin terminal 30b, and so on. As shown in FIG. 5, the pins are established at the chip design stage in such a manner that, illustratively, the external memory pins are numbered counterclockwise (30a' through 30h') and the microcomputer pins clockwise (30a through 30h). For example, a chip M5M28F102J has its pins numbered clockwise, from A15 through A0 and from D0 through D15. In that case, the microcomputer has its pins arranged counterclockwise, from A15 through A0 and from D0 through D15.

In the third embodiment, as described, the signal lines connected to the external memory 3 are arranged in the circular direction exactly opposite to that in which the signal lines connected to the microcomputer 2a are arranged. When the microcomputer 2a and the external memory 3 are mounted back to back, their signal lines are interconnected over the shortest possible distances between the corresponding pin terminals with no signal lines crossing each other. The absence of crossed signal lines makes it easy to bring about a double-layered board design.

The third embodiment reduces the area of the loop formed by the current on the bus 13 between the microcomputer 2a and the external memory 3. With the area S thus lessened in the expression (1) above representing radiation energy, extraneous radiation noise is decreased. Because the bus 13 has the shortest possible length, its parasitic capacitance is lowered and the speed of operation is increased correspondingly. These features offer additional benefits when applied to the first embodiment of the invention.

Embodiment 4

Figure 6:
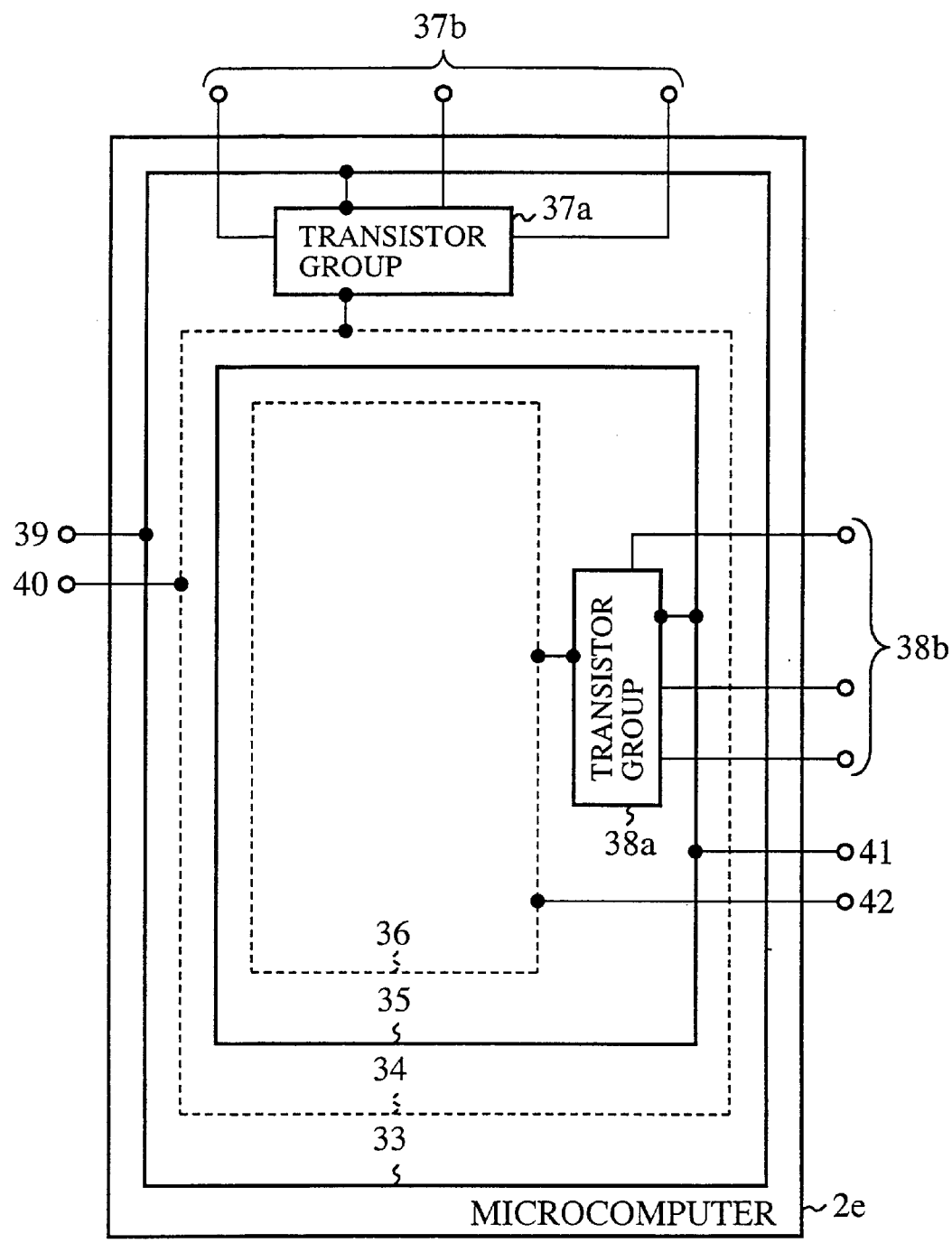
FIG. 6 is a circuit diagram of a microcomputer chip practiced as a fourth embodiment of the invention.

FIG. 6 is a circuit diagram showing a typical circuit constitution of a microcomputer chip practiced as the fourth embodiment of the invention. In FIG. 6, reference numeral 2a stands for a microcomputer; 33 and 35 for a first and a second power supply line (at VDD1 and VDD2 levels) respectively; 34 and 36 for a first and a second ground line respectively; 39 and 41 for a first and a second power supply pad (at VDD1 and VDD2 levels) respectively; and 40 and 42 for a first and a second ground pad respectively. The second power supply line 35 connected to the second power supply pad 41 at the VDD2 level supplies power only to the output transistor group 38a that operates at high speed; the second ground line 36 connected to the second ground pad 42 at ground potential also supplies ground potential to the output transistor group 38a alone. On the other hand, the first power supply line 33 connected to the first power supply pad 39 at the VDD1 level supplies power only to the output transistor group 37a; the first ground potential 34 connected to the first ground pad 40 also supplies ground potential to the output transistor group 37a alone.

With the fourth embodiment, as described, the power supply line is separated into the first and the second power supply lines 33 and 35 to power the output transistor groups 37a and 38a respectively, and the ground line is also separated into the first and the second ground lines 34 and 36 for feeding ground potential to the output transistor groups 37a and 38a respectively. The first power supply line 33 and the first ground line 34 are connected, independently of the second power supply line 35 and the second ground line 36, to the output transistor group 37a that operates at a high frequency for access to the external memory. Even if noises occur on the first power supply line 33 or on the first ground line 34, they do not propagate to the second power supply line 35 or to the second ground line 36, whereby radiation noises are suppressed.

Embodiment 5

In the fifth embodiment, one of the two power supply systems adopted by the fourth embodiment above is selected by a mask option scheme. Alternatively, a further benefit is obtained if one of the two transistor groups is also selected by a mask option scheme in addition to the selection of the power supply line. Illustratively, two-layer aluminum processing may be implemented using two layers of metal wiring composed of aluminum, the processing including through-hole fabrication that provides contacts between first and second metal wiring. During the process of through-hole fabrication, the mask option scheme is used to switch the contacts so as to select the appropriate power supply line. The output transistor group may also be selected at the same time as the power supply line.

With the fifth embodiment, as described, the mask option scheme for through-hole fabrication allows one of the two power supply lines to be selected. Since the power supply line suitable for the driving capability of the respective transistors is selected in the normal fabrication process, selection of the power supply line is optimized without regard to the constraints of an intervening development stage. Furthermore, the use of a mask option scheme permitting the selection of not only the power supply line but also the output transistors provides for the delivery at short notice of products with driving capabilities that vary depending on customers' requirements or on their chip set.

Embodiment 6

Figure 8:
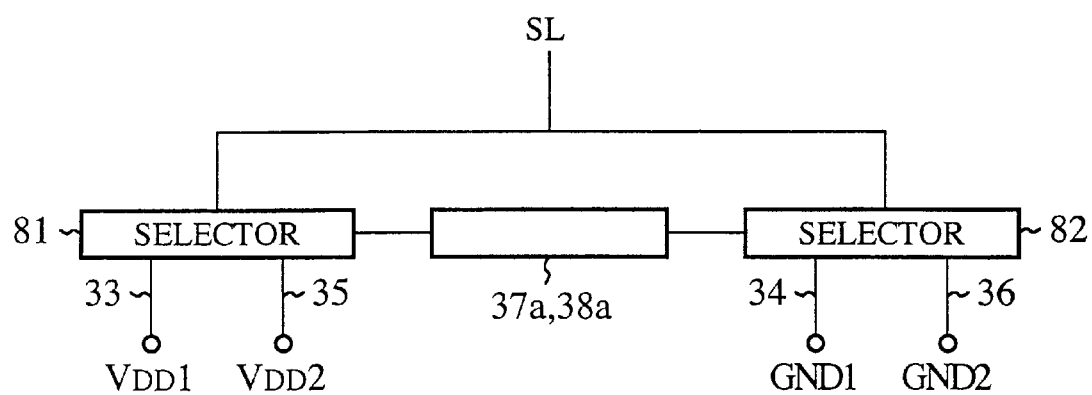
FIG. 8 is a block diagram of the selectors as the sixth embodiment.
Figure 7A:
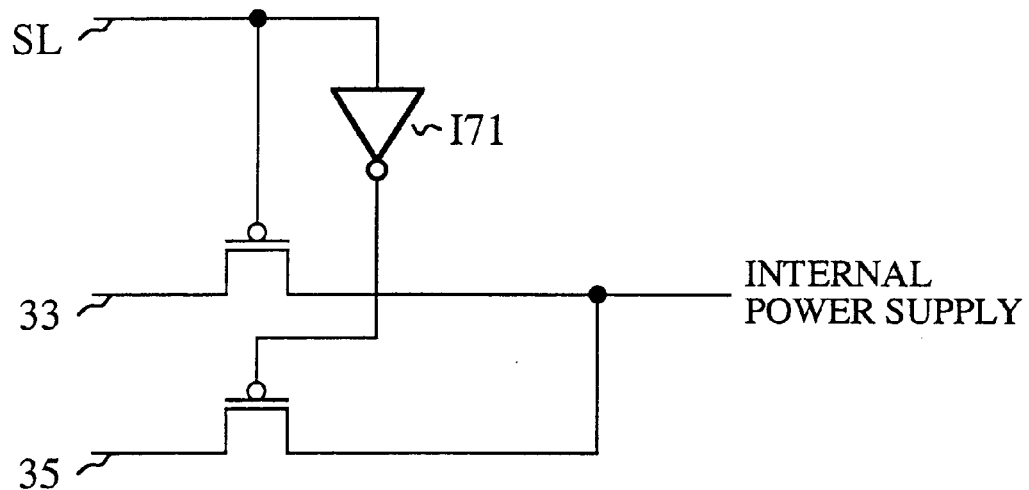
FIGS. 7A and 7B are circuit diagrams of selectors practiced as a sixth embodiment of the invention, FIG. 7A showing a selector on the power supply side, FIG. 7B depicting a selector on the ground line side.
Figure 7B:
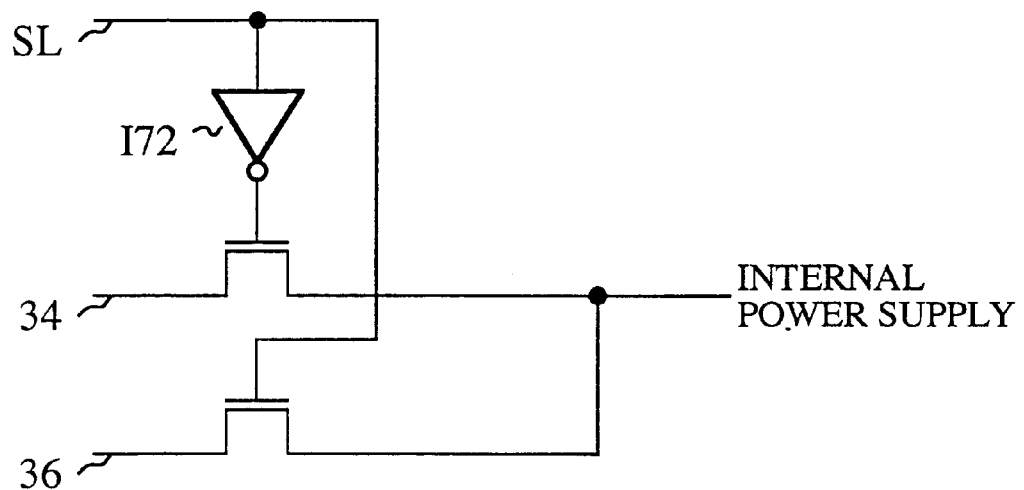

The sixth embodiment, as with the fourth embodiment, is a microcomputer chip that comprises two kinds of power supply lines to choose from using of software. More specifically, at a semiconductor integrated circuit design stage, there are provided selector circuits that select one of the two power supply lines in accordance with input data in an internal register. FIGS. 7A and 7B are circuit diagrams depicting typical selector circuits. FIG. 7A is a circuit diagram of a selector circuit on the power supply side, and FIG. 7B is circuit diagram of a selector circuit on the ground line side. FIG. 8 is a block diagram of the selector circuits as they are connected to a microcomputer 2e. In the figures, reference numerals 33 and 35 stand for a first and a second power supply line respectively; 34 and 36 for a first and a second ground line respectively; 171 and 172 for an inverter gate each; SL for a select signal; 81 for the selector on the power supply line side; and 82 for the selector on the ground line side. The select signal SL is output by the internal register. The value of the internal register may be set as desired by a user through the use of software.

How the sixth embodiment works will now be described.

When the select signal SL is driven "L", the selectors 81 and 82 select the first power supply line 33 and the first ground line 34 respectively as internal power supplies. When the select signal SL is brought "H", the selectors 81 and 82 select the second power supply line 35 and the second ground line 36 respectively as the internal power supplies.

Because the sixth embodiment allows the appropriate power supply line to be selected by software, the user may select where necessary an optimal transistor group while program preparation is still under way. Because the power supply lines are separated depending on the chip set used, only specific signal lines liable to produce noises may be connected selectively to a separate power supply by means of programming.

Embodiment 7

The seventh embodiment utilizes microcomputer chips constituted as the first, the third and the fourth embodiments in order to build a multi-chip module (MCM) that incorporates illustratively an external memory 3 and microcomputers 2a and 2e. How the seventh embodiment is implemented will now be described with reference to the relevant drawings.

Figure 9:
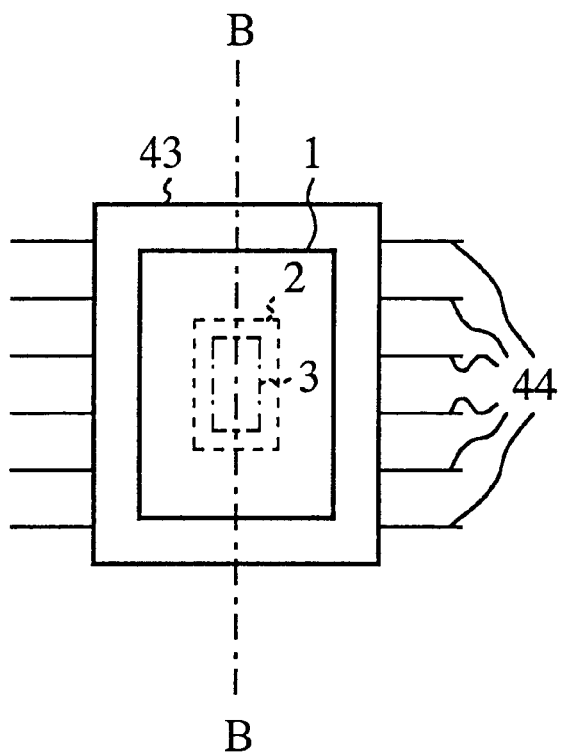
FIG. 9 is a plan view of a multi-chip module practiced as a seventh embodiment of the invention.
Figure 10:
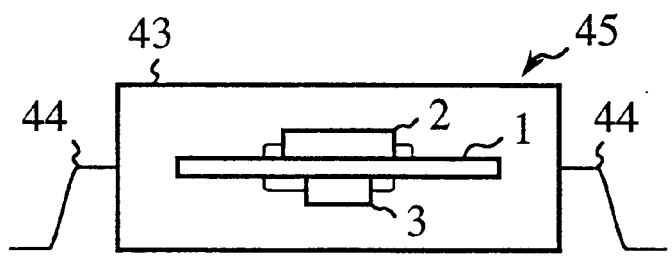
FIG. 10 is a sectional view of the multi-chip module taken on line B—B in the seventh embodiment of FIG. 9.
Figure 11A:
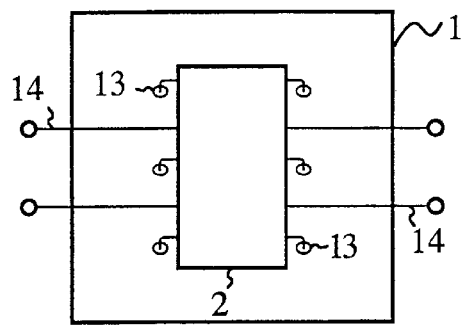
FIGS. 11A and 11B show chip arrangements on a printed-circuit board, the two figures being a top view and a bottom view respectively of the printed-circuit board carrying a multi-chip module practiced as the seventh embodiment.
Figure 11B:
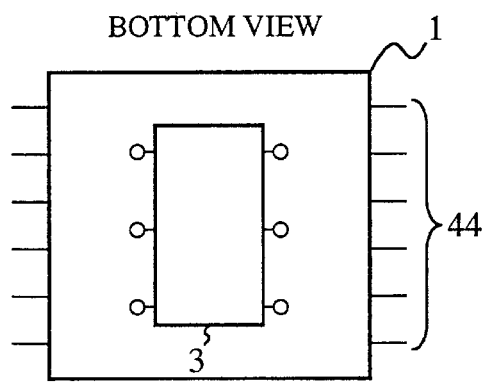

FIG. 9 is a plan view of the multi-chip module practiced as the seventh embodiment of the invention. FIG. 10 is a sectional view of the multi-chip module taken on line B—B in the seventh embodiment of FIG. 9. FIGS. 11A and 11B show chip arrangements on the printed-circuit board, the two figures being a top view and a bottom view respectively of the printed-circuit board carrying the multi-chip module. In the figures, reference numeral 1 stands for the printed-circuit board; 2 for a microcomputer; 3 for an external memory; 13 and 14 for a bus each; 43 for a mold resin; 44 for leads; and 45 for the multi-chip module. In this setup, the bus 13 connecting the external memory 3 with the microcomputer 2 is set to have a relatively small driving capacity under the scheme adopted for the first embodiment. The setup eliminates the need to expose outside the mold the wiring of the bus 13 connecting the external memory 3 with the microcomputer 2. For output to the outside, the same pin arrangements as those of the mask version may be implemented by way of the bus 14 separated as shown in FIG. 1.

With the seventh embodiment, as described, the multi-module chip containing the microcomputers 2 and the external memory 3 allows all terminals for output to the outside of the chip to be used like a single-chip microcomputer. The multi-chip module and a single-chip microcomputer may easily switch their places because their pin arrangements and pin functions are made substantially the same.

Since the inventive MCMs are each composed of existing chips, they may be delivered to the customer at a short notice, e.g., in about three weeks. By contrast, single-chip microcomputers may have to wait for as long as three months before their delivery is completed.

Using any one of the first, the third and the fourth embodiments reduces extraneous radiation noises and lowers power dissipation for the reasons discussed in connection with the first embodiment. Multi-chip modules are subject to constrains on the layout of a plurality of chips to be molded. Given the additional restriction of package size, multi-chip modules should not occupy a large area when assembled. Although it is possible to build a multi-chip module in a multiple layer wiring arrangement, doing so would result in high fabrication costs. By contrast, the seventh embodiment of the invention efficiently utilizes the printed-circuit board 1 because the microcomputer 2 and the external memory 3 are mounted on and connected through both sides of the board 1. With its configuration thus simplified, the seventh embodiment offers another benefit of reduced assembly costs.

Embodiment 8

Figure 12:
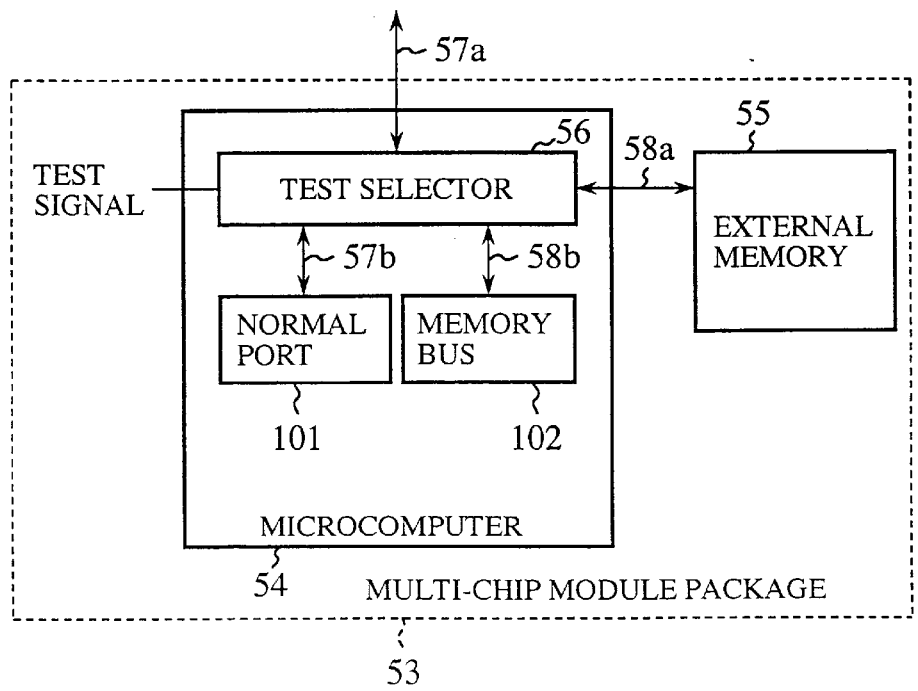
FIG. 12 is a block diagram of a multi-chip module practiced as an eighth embodiment of the invention.

FIG. 12 is a block diagram of a multi-chip module (MCM) practiced as the eighth embodiment of the invention. In FIG. 12, reference numeral 53 stands for an MCM package; 54 for a microcomputer; 55 for an external memory; 56 for a test selector; 101 for a normal port; 102 for a memory bus; 57a for an input/output signal line group; 57b for a normal port output signal line group; 58a for an external memory signal line group; and 58b for a memory bus signal line group. The input/output signal line group 57a is connected to the microcomputer 54 via an external terminal of the MCM package 53. The memory bus signal line group 58b includes a data/address bus between the external memory 55 and the microcomputer 54. When a test signal is nonactive, the test selector 56 serves to connect the normal port signal line group 57b to the input/output signal line group 57a, and the memory bus signal line group 58b to the external memory 55.

Figure 13:
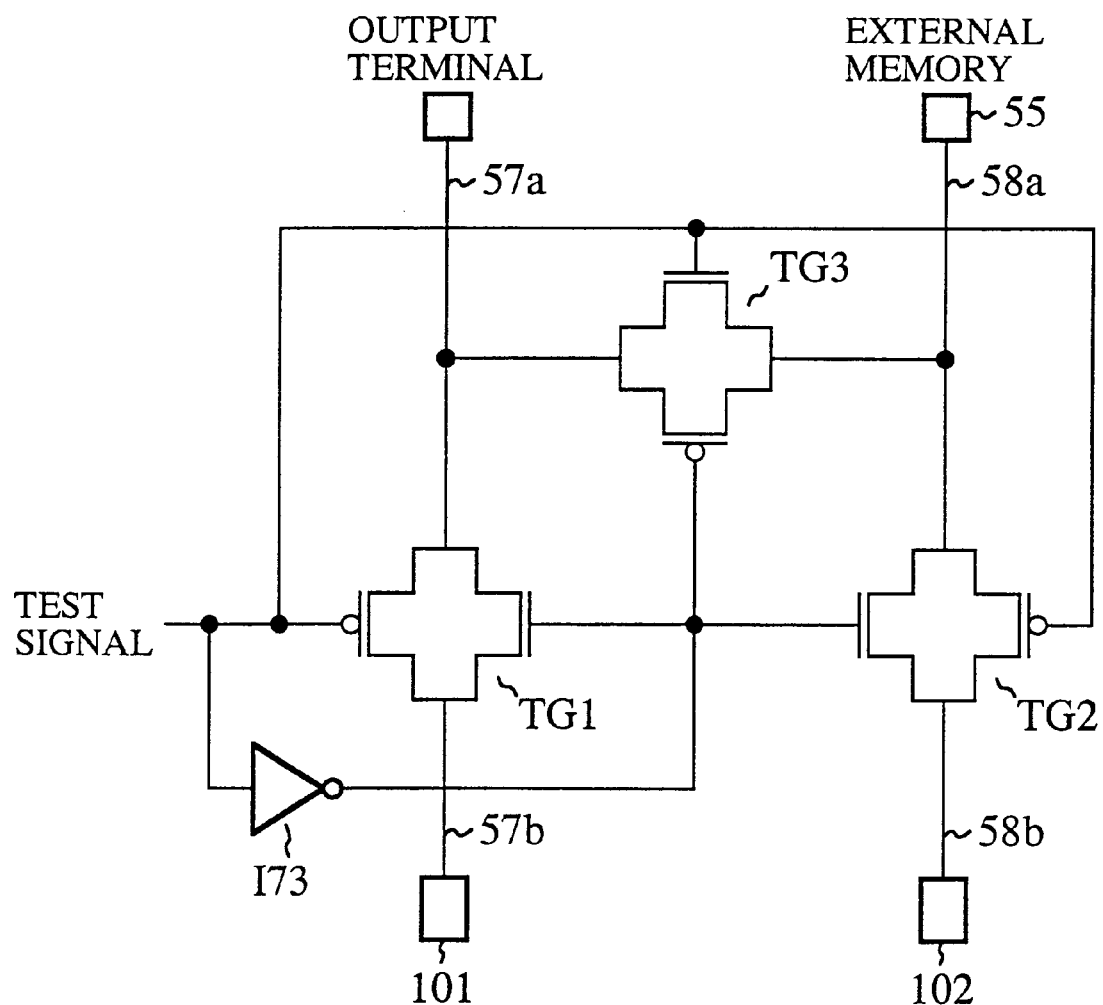
FIG. 13 is a circuit diagram of a test selector constituting part of the eighth embodiment.
Figure 14:
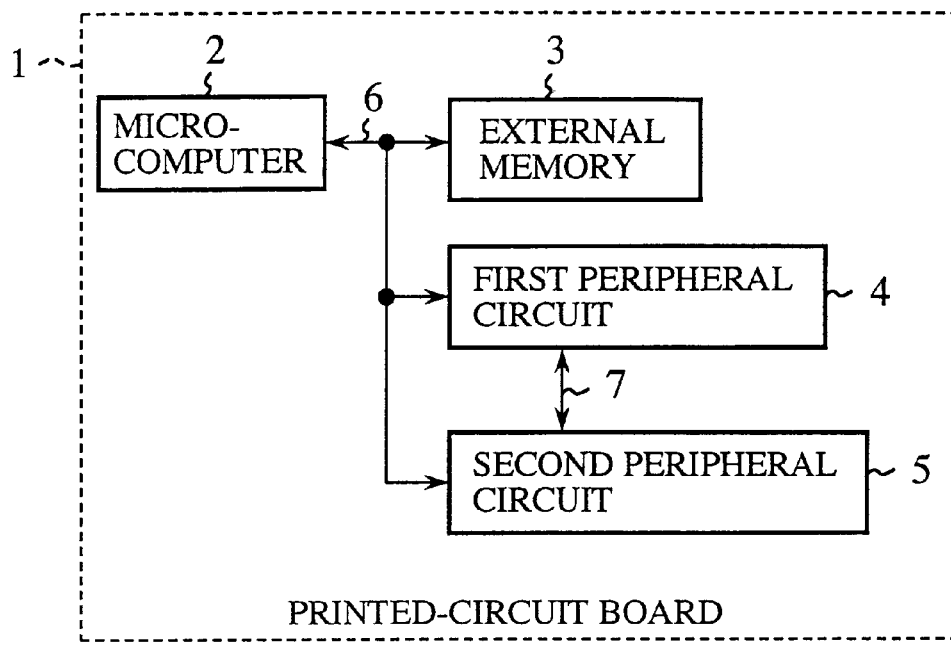
FIG. 14 is a block diagram of a conventional one-board microcomputer device.
Figure 15:
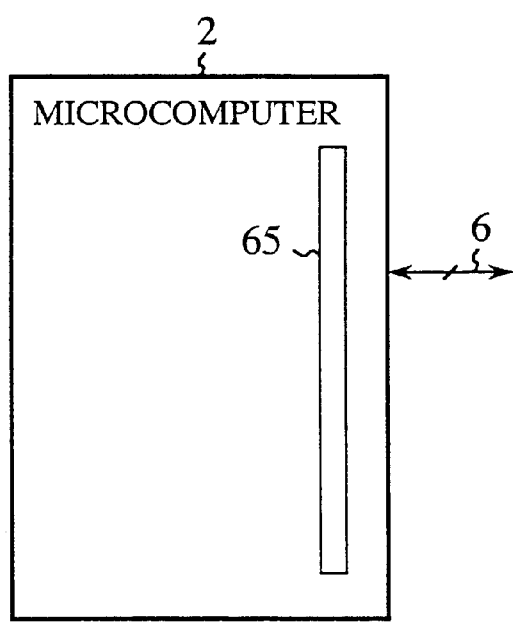
FIG. 15 is a partial explanatory view of a conventional microcomputer.
Figure 16:
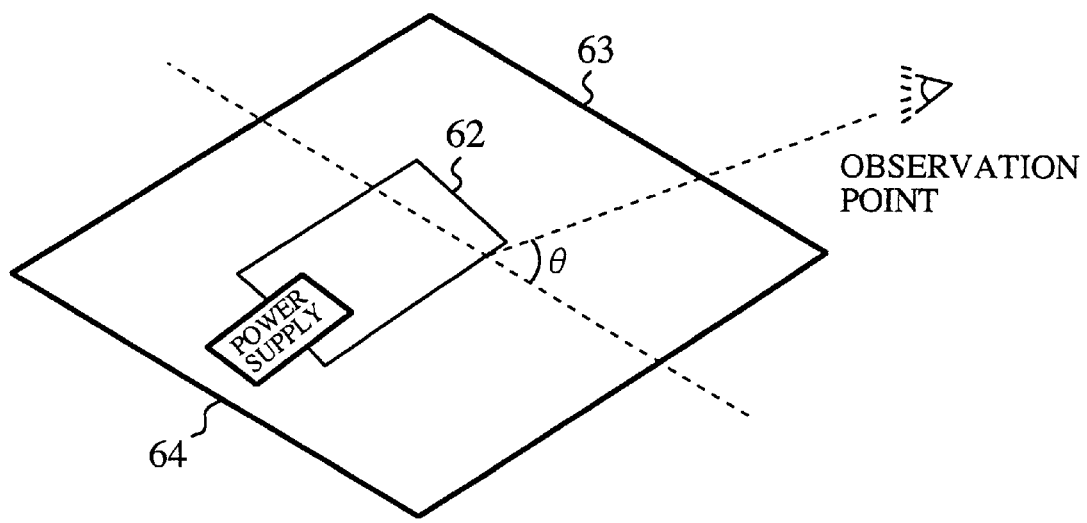
FIG. 16 is an explanatory view showing an angle between a plane formed by a current loop and an observation point.
Figure 17:
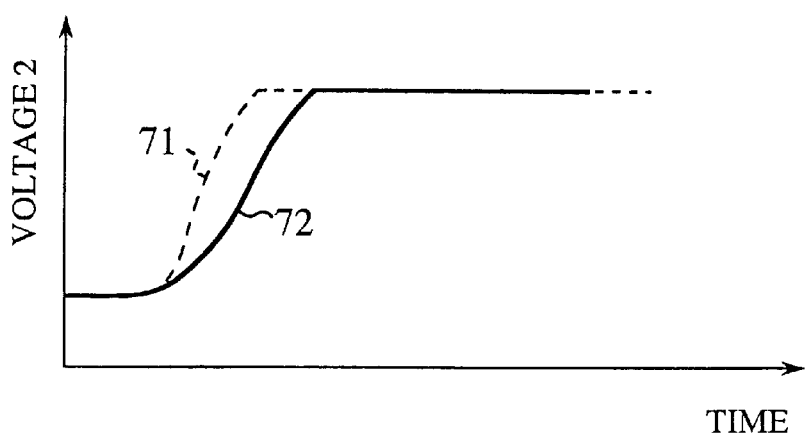
FIG. 17 is a graphic representation showing how time and voltage are related in comparing leading edges of output waveforms of transistors with different driving capacities.
Figure 18A:
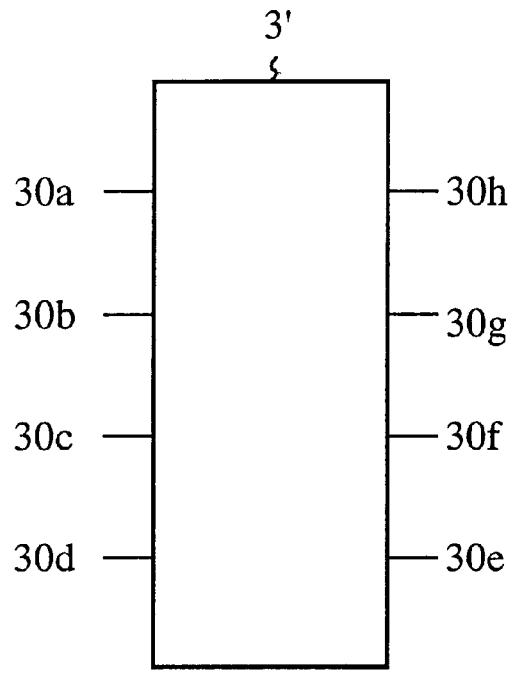
FIGS. 18A and 18B are pin terminal layout views of an external memory and a conventional microcomputer.
Figure 18B:
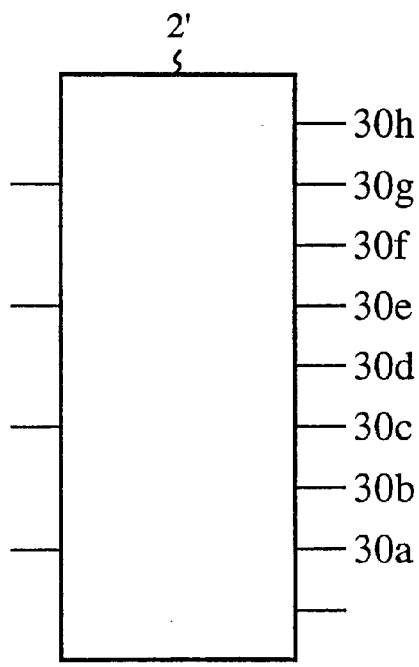
Figure 19:
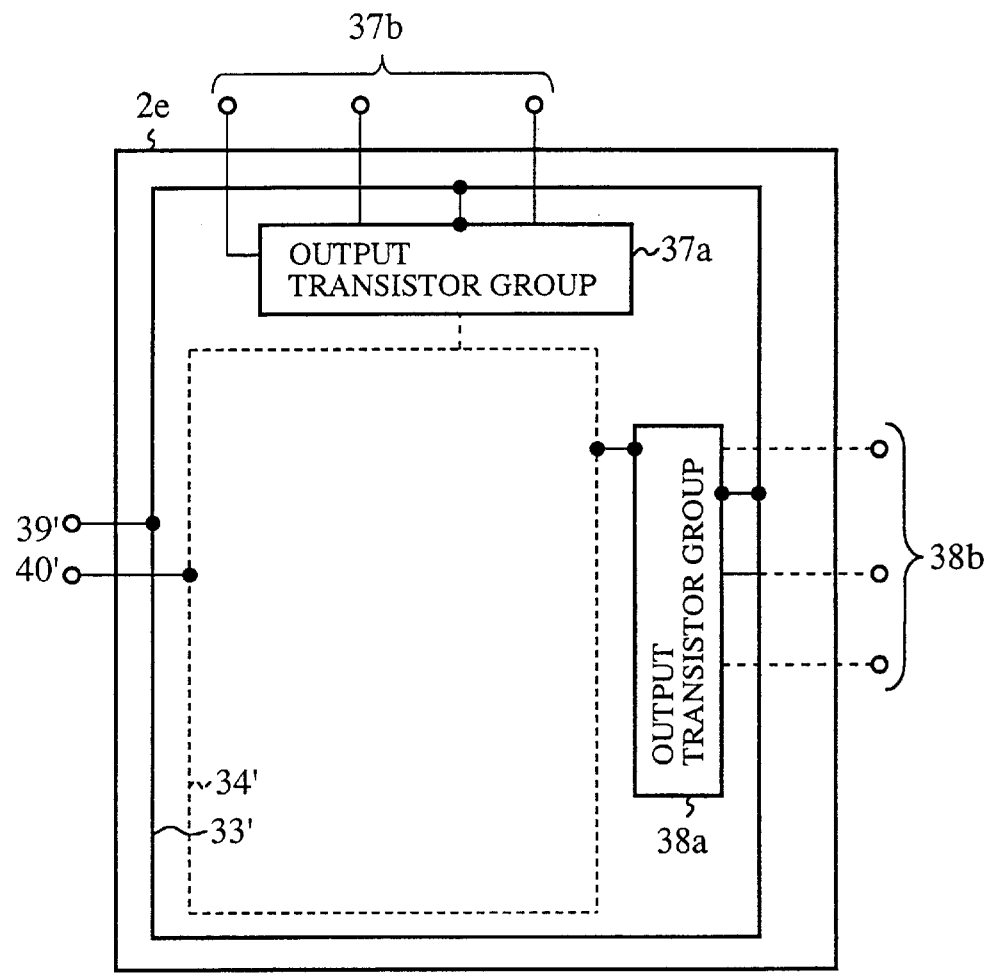
FIG. 19 is a schematic view sketching power supply connections of a conventional microcomputer.
Figure 20:
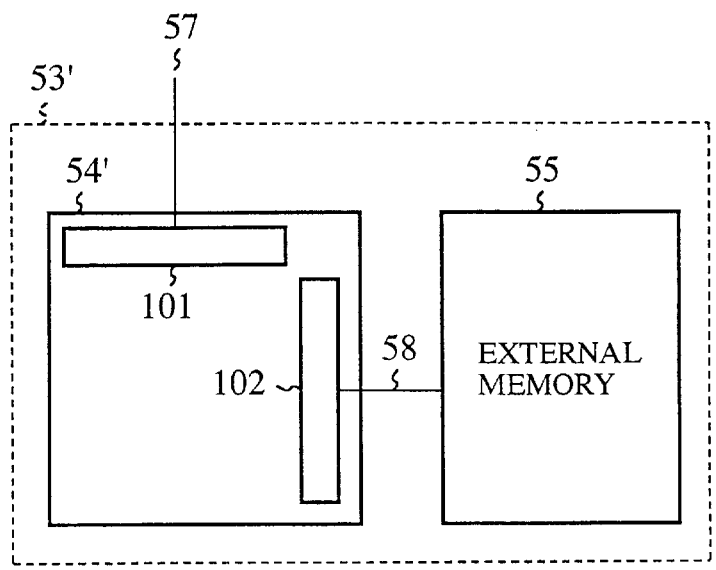
FIG. 20 is a block diagram of a conventional multi-chip module (MCM).

FIG. 13 is a circuit diagram of the test selector 56. In FIG. 13, reference numerals TG1 through TG3 stand for transmission gates composed of a PMOS and an NMOS transistor each, and 173 for an inverter gate. The other components are the same as those in the setup of FIG. 12 and are thus designated by like reference numerals. Detailed descriptions of such components are omitted where they are repetitive.

How the eighth embodiment works will now be described. In FIG. 13, the input of a nonactive test signal (i.e., a test signal "L") brings about normal mode; driving the input test signal "H" establishes test mode. More specifically, bringing the input test signal "L" turns on the transmission gates TG1 and TG2. This connects the input/output signal line group 57a with the normal port signal line group 57b, and the external memory signal line group 58a with the memory bus signal line group 58b. Driving the input test signal "H" turns on the transmission gate TG3. This connects the input/output signal line group 57a with the external memory signal line group 58a, allowing the external memory 55 to be tested.

In the structure described, simply driving the test signal "H" (i.e., active) allows the external memory signal line group 58a of the external memory 55 coupled only with the microcomputer 54 to be connected to the input/output signal line group 57a via an external terminal of the MCM package. This makes it possible to test the memory chip alone. It follows that conventional testing procedures applicable to the external memory 55 and microcomputer 54 may be utilized unmodified.

With the eighth embodiment, as described, only the external memory 55 may be tested for failure analysis. The testing on the external memory 55 may be readily separated from that on the microcomputer 54. After the separation of tests, the traditionally employed testing procedures may be applied unchanged to the external memory 55 and microcomputer 54. This means that failure analysis may be conducted with a high degree of freedom through the direct input of necessary test patterns. In addition, the test patterns used on the external memory 55 and microcomputer 54 may be applied unmodified to the tests on final products. This contributes to shortening the time required for developing test patterns.

As many apparently different embodiments of this invention may be made without departing from the spirit and scope thereof, it is to be understood that the invention is not limited to the specific embodiments thereof except as defined in the appended claims.

What is claimed is:

1. A microcomputer for accessing an external memory, said microcomputer comprising:

a plurality of first transistors for driving first signal lines for accessing an external memory;

a plurality of first terminals coupled to said first transistors and dedicated to transmitting address and data signals from said first transistors to the external memory only, through the first signal lines;

a plurality of second transistors driving second signal lines for accessing a plurality of external circuits other than the external memory; and a plurality of second terminals connecting said second transistors to the second signal lines, wherein said first transistors are smaller in size that said second transistors.

2. The microcomputer according to claim 1, wherein said first terminals and said second terminals are alternatingly arranged.

3. The microcomputer according to claim 1, wherein said microcomputer and the external memory are mounted on the opposing sides of a substrate and wherein said first terminals are arranged to coincide in layout with terminals of the external memory so that the first signal lines interconnecting corresponding terminals of said microcomputer and the external memory do not cross one another when laid out over shortest possible distances on the substrate.

4. The microcomputer according to claim 1, comprising:

a first power supply line and a first ground line used by said first transistors for driving the first signal lines; and a second power supply line and a second ground line used by said second transistors for accessing another external circuit, wherein said first and second power supply lines and said first and second ground lines are spaced from pads of a chip.

5. The microcomputer according to claim 4, wherein said first power supply line and said first ground line comprise a first power supply system, wherein said second power supply line and said second ground line comprise a second power supply system, and wherein one of said first and second power supply systems is selected by designating at least one mask during wafer processing.

6. The microcomputer according to claim 5, comprising a selector circuit including a register for selecting said first or said second power supply systems as a power supply system for powering said first and second transistors according to contents of said register.

7. The microcomputer according to claim 5, wherein one of said first and second power supply systems is selected together with transistors to be powered by the selected power system.

8. A multi-chip module comprising:

a substrate having opposite first and second sides;

a microcomputer located on the first side of said substrate; and an external memory located on the second side of said substrate, wherein said microcomputer comprises:

a plurality of first terminals for transmitting address and data signals only to said external memory; and a plurality of second terminals for accessing external devices other than said external memory, wherein pin assignments of said multi-chip module are substantially the same as those of a microcomputer having an internal memory.

9. A multi-chip module comprising:

a microcomputer;

an external memory; and an external memory signal line group connecting said microcomputer to said external memory, said microcomputer comprising:

a normal port;

a memory bus; and a selector including:

an output terminal for receiving input/output signals including test patterns; and a plurality of transmission gates for connecting said output terminal to said external memory signal line group and disconnecting said output terminal from said memory bus and said normal port in response to an active state of a control signal and for disconnecting said output terminal from said external memory signal line group, connecting said output terminal to said normal port, and connecting said external memory signal line group to said memory bus in response to an inactive state of the control signal.

* * * * *

UNITED STATES PATENT AND TRADEMARK OFFICE
CERTIFICATE OF CORRECTION

PATENT NO. : 5,907,507
DATED : May 25, 1999
INVENTOR(S) : WATANABE et al.

It is certified that error appears in the above-identified patent and that said Letters Patent is hereby corrected as shown below:

Title page,
In item [75], Inventors, change ", both" to --; Hideo Matsui, all--.

Column 14, line 22, change "that" to --than--.

Signed and Sealed this

Ninth Day of May, 2000

Attest:

Q. TODD DICKINSON

*Attesting Officer*   *Director of Patents and Trademarks*